US012451472B2

United States Patent
Lee et al.

(10) Patent No.: US 12,451,472 B2
(45) Date of Patent: Oct. 21, 2025

(54) MOTHER PANEL FOR DISPLAY PANEL

(71) Applicant: Samsung Display Co., LTD., Yongin-si (KR)

(72) Inventors: Seung-Kyu Lee, Cheonan-si (KR); Wontae Kim, Suwon-si (KR); Hyungjune Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 689 days.

(21) Appl. No.: 17/731,099

(22) Filed: Apr. 27, 2022

(65) Prior Publication Data
US 2022/0384400 A1    Dec. 1, 2022

(30) Foreign Application Priority Data

May 27, 2021  (KR) .................. 10-2021-0068586

(51) Int. Cl.
*H01L 25/16*    (2023.01)
*H10H 20/858*   (2025.01)
*H10D 86/40*    (2025.01)
*H10D 86/60*    (2025.01)

(52) U.S. Cl.
CPC ....... *H01L 25/167* (2013.01); *H10H 20/8583* (2025.01); *H10D 86/411* (2025.01); *H10D 86/451* (2025.01); *H10D 86/60* (2025.01); *H10H 20/8581* (2025.01)

(58) Field of Classification Search
CPC .......................... H01L 25/167; H10H 20/8583
See application file for complete search history.

(56) References Cited

U.S. PATENT DOCUMENTS

| | | | |
|---|---|---|---|
| 8,178,878 B2 * | 5/2012 | Chien ................ | H10D 86/441 257/776 |
| 9,885,922 B2 * | 2/2018 | Song ................... | G02F 1/1337 |
| 11,639,551 B2 * | 5/2023 | Lee ..................... | H10K 59/1283/13 |
| 11,856,803 B2 * | 12/2023 | Lim .................... | H01L 25/167 |

(Continued)

FOREIGN PATENT DOCUMENTS

| | | |
|---|---|---|
| JP | 2008-33186 A | 2/2008 |
| JP | 2019-178032 A | 10/2019 |

(Continued)

OTHER PUBLICATIONS

International Search Report, with English translation, dated Sep. 2, 2022, for International Application No. PCT/KR2022/007268, 5 pages.

*Primary Examiner* — Eugene Lee
(74) *Attorney, Agent, or Firm* — Womble Bond Dickinson (US) LLP

(57) ABSTRACT

A mother panel for a display panel includes: a mother substrate including a display panel area and a dummy area surrounding the display panel area, the mother substrate having a cutting line defined thereon, wherein the cutting line is configured to be irradiated by a laser along a boundary between the display panel area and the dummy area; and a first heat dissipation pattern on the mother substrate, extending from the display panel area to the dummy area to overlap the cutting line, and including a first rod portion including a plurality of lower rods spaced apart from each other and a first body portion in the dummy area and contacting the first rod portion.

25 Claims, 12 Drawing Sheets

(56) References Cited

U.S. PATENT DOCUMENTS

| | | | |
|---|---|---|---|
| 2005/0099583 A1* | 5/2005 | Moriyama | G02F 1/133351 |
| | | | 349/187 |
| 2009/0268130 A1* | 10/2009 | Yeh | G02F 1/1339 |
| | | | 349/73 |
| 2012/0319574 A1* | 12/2012 | Kim | H05B 33/04 |
| | | | 313/512 |
| 2015/0034935 A1* | 2/2015 | Choi | H10K 50/844 |
| | | | 257/40 |
| 2015/0102300 A1 | 4/2015 | Gong | |
| 2015/0311409 A1* | 10/2015 | Huang | G02F 1/1333 |
| | | | 257/99 |
| 2016/0284781 A1 | 9/2016 | Jiang et al. | |
| 2017/0098797 A1* | 4/2017 | Eom | H10K 59/1213 |
| 2017/0179159 A1* | 6/2017 | Kawata | H10D 86/441 |
| 2018/0026225 A1* | 1/2018 | Kwon | H10K 59/873 |
| | | | 257/40 |
| 2018/0102502 A1* | 4/2018 | Kim | H10K 59/124 |
| 2020/0209674 A1 | 7/2020 | Won et al. | |
| 2022/0324059 A1* | 10/2022 | Seo | B23K 26/364 |
| 2022/0382097 A1* | 12/2022 | Li | G02F 1/133514 |

FOREIGN PATENT DOCUMENTS

| | | |
|---|---|---|
| JP | 2019-179175 A | 10/2019 |
| KR | 10-2019-0037383 | 4/2019 |
| KR | 10-2022393 B1 | 9/2019 |
| KR | 10-2100374 B1 | 4/2020 |

* cited by examiner

MOTHER PANEL FOR DISPLAY PANEL

CROSS-REFERENCE TO RELATED APPLICATION

The present application claims priority to and the benefit of Korean Patent Application No. 10-2021-0068586, filed on May 27, 2021, the entire disclosure of which is hereby incorporated by reference.

BACKGROUND

1. Field

Aspects of some embodiments of the present disclosure relate generally to a mother panel for a display panel.

2. Discussion of the Background

In general, a display panel may not be manufactured as a single unit. Rather, in order to improve productivity, a mother panel having a size several to several hundred times a size of the final display panel may be formed, and then divided or separated into each of the display panel units during the manufacturing process, to manufacture individual completed display panels.

Laser cutting may be used to separate the display panel from the mother panel. However, by irradiating the laser, heat may be generated. The generated heat may be transmitted to the display panel, which may damage organic layers in the display panel.

The above information disclosed in this Background section is only for understanding of the background of the present disclosure, and, therefore, it may contain information that does not constitute a prior art.

SUMMARY

Aspects of some embodiments of the present disclosure relate generally to a mother panel for a display panel. For example, aspects of some embodiments of the present disclosure relate to a mother panel for a display panel used in a manufacturing process of a display device.

Some embodiments of the present disclosure provide a mother panel for a display panel with improved process reliability.

According to some embodiments, a mother panel for display panel may include a mother substrate including a display panel area and a dummy area surrounding the display panel area, the mother substrate having a cutting line defined thereon, wherein the cutting line is configured to be irradiated by a laser along a boundary between the display panel area and the dummy area, and a first heat dissipation pattern on the mother substrate, extending from the display panel area to the dummy area to overlap the cutting line, and including a first rod portion including a plurality of lower rods spaced apart from each other and a first body portion in the dummy area and contacting the first rod portion.

According to some embodiments, the first rod portion may extend in a direction perpendicular to the cutting line to contact the first body portion.

According to some embodiments, at least two of the plurality of the lower rods may extend in different directions to contact the first body portion.

According to some embodiments, an area in which each of the plurality of the lower rods overlaps the dummy area may be greater than an area in which each of the plurality of the lower rods overlaps the display panel area.

According to some embodiments, an area in which the first heat dissipation pattern overlaps the dummy area may be greater than an area in which the first heat dissipation pattern overlaps the display panel area.

According to some embodiments, an area of the first body portion may be greater than an area of each of the plurality of the lower rods.

According to some embodiments, a width of each of the plurality of the lower rods may be smaller than a width of the first body portion.

According to some embodiments, a width of each of the plurality of the lowed rods may be same.

According to some embodiments, the first rod portion may include a same material as the first body portion.

According to some embodiments, the first heat dissipation pattern may include metal.

According to some embodiments, the mother panel may further include an organic layer on the mother substrate in the display panel area and including an organic material.

According to some embodiments, the first heat dissipation pattern may be on the organic layer.

According to some embodiments, the first heat dissipation pattern may be between the mother substrate and the organic layer.

According to some embodiments, the mother panel may further include a second heat dissipation pattern on the first rod portion, extending from the display panel area to the dummy area to overlap the cutting line, and including a second rod portion including a plurality of upper rods spaced apart from each other and a second body portion in the dummy area and contacting the second rod portion.

According to some embodiments, the mother panel may further include an organic layer between the first heat dissipation pattern and the second heat dissipation pattern and including an organic material.

According to some embodiments, the plurality of the lower rods may do not overlap the plurality of the upper rods.

According to some embodiments, the mother panel may further include a transistor layer including a metal layer on the mother substrate, a buffer layer on the metal layer, an active layer on the buffer layer, a gate electrode on the active layer, an interlayer insulating layer on the gate electrode, a connection electrode on the interlayer insulating layer, a first passivation layer on the connection electrode, and a first planarization layer on the first passivation layer, a light emitting diode layer including a first electrode on the first planarization layer, a second electrode on the first planarization layer and spaced apart from the first electrode, a light emitting diode between the first electrode and the second electrode, a second passivation layer on the light emitting diode, and a second planarization layer on the second passivation layer, a wavelength conversion layer including a wavelength conversion part on the second planarization layer and a third planarization layer on the wavelength conversion part, a color filter layer including a color filter on the third planarization layer and a third passivation layer on the color filter, and an encapsulation layer on the third passivation layer.

According to some embodiments, the first passivation layer and the first planarization layer may extend from the display panel area to the dummy area. The first heat dissipation pattern may be between the first passivation layer and the first planarization layer.

According to some embodiments, the first planarization layer may extend from the display panel area to the dummy area. The first heat dissipation pattern may be on the first planarization layer.

According to some embodiments, the first heat dissipation pattern may include a same material as the first electrode.

According to some embodiments, the second passivation layer and the second planarization layer may extend from the display panel area to the dummy area. The first heat dissipation pattern may be between the second passivation layer and the second planarization layer.

According to some embodiments, the second planarization layer may extend from the display panel area to the dummy area. The first heat dissipation pattern may be on the second planarization layer.

According to some embodiments, the third passivation layer and the encapsulation layer may extend from the display panel area to the dummy area. The first heat dissipation pattern may be between the third passivation layer and the encapsulation layer.

According to some embodiments, the mother substrate may include an organic material. The first heat dissipation pattern may be on the mother substrate.

According to some embodiments, the mother substrate may include polyimide.

According to some embodiments, the first heat dissipation pattern may include a same material as the metal layer.

The mother panel may include the first heat dissipation pattern on the mother substrate, extending from the display panel area to the dummy area to overlap the cutting line, and including a first rod portion including a plurality of lower rods spaced apart from each other and a first body portion in the dummy area and contacting the first rod portion.

The area of the first rod portion overlapping with the dummy area may be greater than the area overlapping with the display panel area of the first rod portion. Accordingly, heat generated by irradiating the laser along the cutting line may be transmitted to the dummy area. Damage to the organic layer included in the display panel area due to the heat may be minimized.

As the first rod portion contacts the first body portion on the dummy area, the amount of heat transmitted to the dummy area may further increase. A heat dissipation effect of reducing the amount of heat transmitted to the display panel area may be increased. Because the organic layer is between the first and second heat dissipation patterns, the heat dissipation effect may be maximized or improved.

In addition, the width of each of the lower rods may be smaller than the width of the first body portion. Because each of the lower rods is finely formed, it is possible to minimize the possibility of interfering with laser cutting by reflecting the laser irradiated along the cutting line.

It is to be understood that both the foregoing general description and the following detailed description are examples that are intended to provide further explanation of the present disclosure.

BRIEF DESCRIPTION OF THE DRAWINGS

The accompanying drawings, which are included to provide a further understanding of the present disclosure and are incorporated in and constitute a part of this specification, illustrate embodiments of the present disclosure, and together with the description serve to explain the inventive concepts.

DETAILED DESCRIPTION

Aspects of illustrative, non-limiting embodiments of the present disclosure will be more clearly understood from the following detailed description in conjunction with the accompanying drawings.

Figure 1:
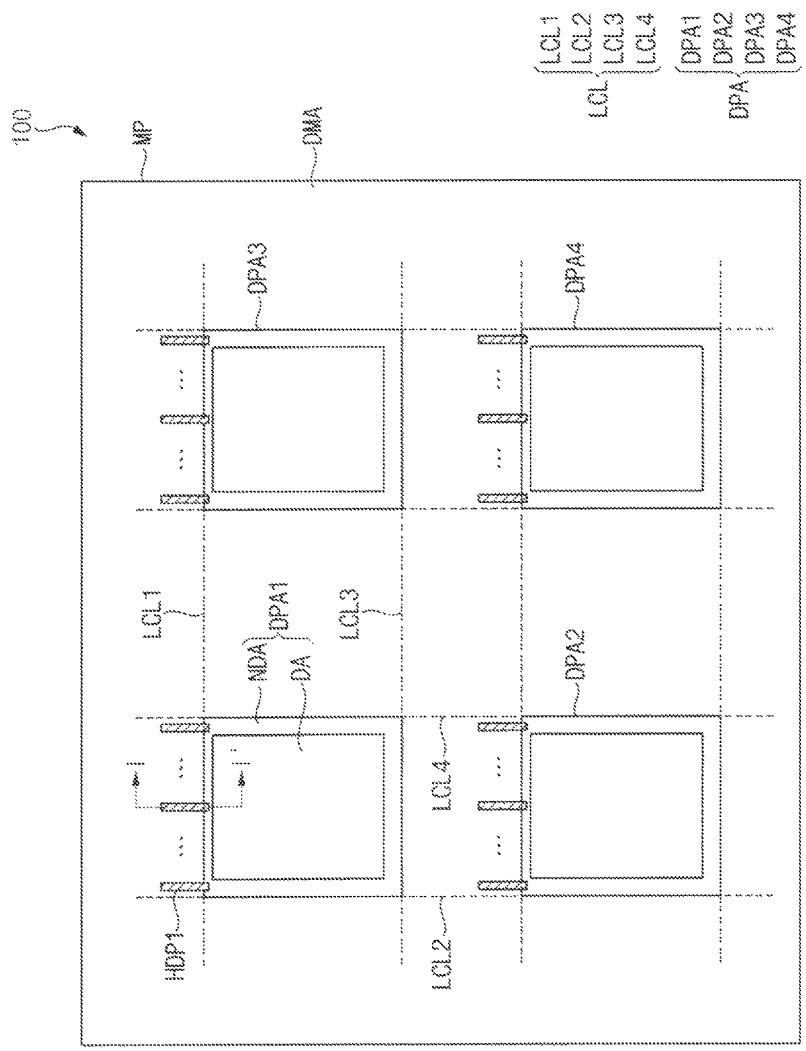
FIG. 1 is a plan view illustrating a mother panel for a display panel according to some embodiments.

FIG. 1 is a plan view illustrating a mother panel for a display panel according to some embodiments.

Referring to FIG. 1, a mother panel 100 for a display panel according to some embodiments of the present disclosure may include a mother substrate MP and a first heat dissipation pattern HDP1 located or formed on the mother substrate MP.

The mother substrate MP may include a display panel area (or a plurality of display panel areas or sub-areas) DPA and a dummy area DMA surrounding or outside of (e.g., outside a footprint of) the display panel area DPA. The display panel area DPA and the dummy area DMA may be configured to be separated (e.g., physically separated or disconnected from each other) by using a laser (e.g., to cut along a laser or cutting line). The display panel area DPA may include first to fourth display panel areas DPA1, DPA2, DPA3, and DPA4. However, the display panel area DPA is not limited to including the first to fourth display panel areas DPA1, DPA2, DPA3, and DPA4, and as a person having ordinary skill in the art would recognize, the display panel area DPA may include any suitable number of display panel areas according to the design of the mother panel 100. For example, the display panel area DPA may include several to several hundred display panel areas.

For convenience of description, intervals between the first to fourth display panel areas DPA1, DPA2, DPA3, and DPA4 are illustrated as being relatively large compared to the width and heights of the first to fourth display panel areas DPA1, DPA2, DPA3, and DPA4, but this is only for the purpose of illustration, and the intervals may vary according to the design of the mother panel 100. For example, according to some embodiments, an interval between the first to fourth display panel areas DPA1, DPA2, DPA3, and DPA4 may be about 100 µm. The display panel area DPA may have a rectangular shape. However, a shape of the display panel area DPA is not limited. For example, the shape of the display panel area DPA may have a rectangular shape with rounded corners, a square shape, a circular shape, a polygonal shape, or any suitable shape according to the design of the mother panel 100 and/or the display panel area DPA.

A finally commercialized display device may include a display panel and an external device (e.g., a display driver, power supply, etc.) for driving the display panel. The display panel area DPA may correspond to the display panel. The display panel area DPA may include a display area DA in which the display device displays images and a non-display area NDA at which the external device is mounted or positioned. The dummy area DMA may be a portion that is not substantially commercialized. That is, in some embodiments, the dummy area DMA may be discarded after the display panel area DPA and the dummy area DMA are mechanically or physically disconnected or separated from each other.

A cutting line LCL that the laser is irradiated may be defined along a boundary between the display panel area DPA and the dummy area DMA. The cutting line LCL may include first to fourth cutting lines LCL1, LCL2, LCL3, and LCL4 surrounding the first display panel area DPA1. To improve efficiency, one cutting line LCL may overlap boundaries of at least two of the first to fourth display panel areas DPA1, DPA2, DPA3, and DPA4. For example, the first cutting line LCL1 may overlap a boundary between the first display panel area DPA1 and the dummy area DMA and a boundary between the third display panel area DPA3 and the dummy area DMA. Accordingly, the display panel area DPA may be arranged in a matrix form. However, the arrangement of the display panel area DPA is not limited and the display panel area DPA may be arranged in various forms.

The first heat dissipation pattern HDP1 may include a metal. The first heat dissipation pattern HDP1 may include a material having high thermal conductivity. For example, the first heat dissipation pattern HDP1 may include a thermally conductive or metal material such as copper and/or aluminum. Also, the first heat dissipation pattern HDP1 may include an alloy such as an alloy containing copper and an alloy containing aluminum.

The first heat dissipation pattern HDP1 may extend from the display panel area DPA to the dummy area DMA and may overlap the cutting line LCL. According to some embodiments, the first heat dissipation pattern HDP1 may extend from the first display panel area DPA1 to the dummy area DMA and may overlap the first cutting line LCL1. Although the first heat dissipation pattern HDP1 is illustrated as being located on one side of the first display panel area DPA1, embodiments according to the present disclosure are not limited thereto. The first heat dissipation pattern HDP1 may be located on another side of the first display panel area DPA1 to overlap the second cutting line LCL2, the third cutting line LCL3, or the fourth cutting line LCL4. Also, the first heat dissipation pattern HDP1 is not limited to overlapping any one of the first to fourth cutting lines LCL1, LCL2, LCL3, and LCL4. A plurality of first heat dissipation patterns HDP1 may be provided and each of the first heat dissipation patterns HDP1 may overlap any one of the first to fourth cutting lines LCL1, LCL2, LCL3, and LCL4.

An area overlapping the dummy area DMA of the first heat dissipation pattern HDP1 may be greater than an area overlapping the display panel area DPA of the first heat dissipation pattern HDP1. A portion of the first heat dissipation pattern HDP1 may overlap the display panel area DPA, and a majority of the first heat dissipation pattern HDP1 may overlap the dummy area DMA. The first heat dissipation pattern HDP1 may not cross the first display panel area DPA1. The first heat dissipation pattern HDP1 may not extend from the first display panel area DPA1 to the dummy area DMA in both directions. The first heat dissipation pattern HDP1 may not overlap the first cutting line LCL1 and the third cutting line LCL3 at the same time.

Figure 2:
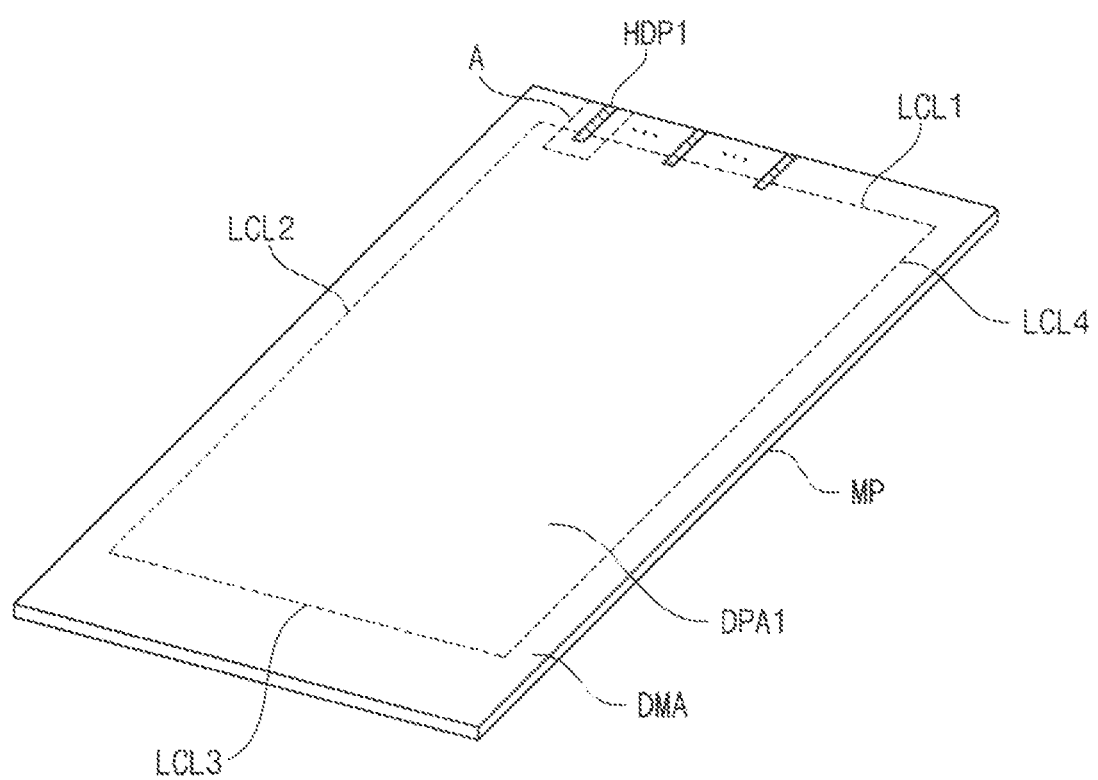
FIG. 2 is a perspective view illustrating a periphery of a first display panel area of FIG. 1.

FIG. 2 is a perspective view illustrating a periphery of a first display panel area of FIG. 1. Because the first to fourth display panel areas DPA1, DPA2, DPA3, and DPA4 include the same components, the first display panel area DPA1 will be described in more detail below.

Referring to FIG. 2, the mother substrate MP may include glass, quartz, plastic, and the like. When the mother substrate MP includes plastic, the mother substrate MP may have flexible, foldable, bendable, rollable, or stretchable properties. The mother substrate MP may include an organic material. According to some embodiments, the mother substrate MP may include polyimide (PI). According to some embodiments, the mother substrate MP may include at least one selected from the group consisting of polyethersulfone (PES), polyacrylate, polyetherimide (PEI), polyethylene naphthalate (PEN), polyethylene terephthalate (PET), polyphenylene sulfide (PPS), polyarylate, polycarbonate (PC), and cellulose acetate propionate (CAP). The mother substrate MP may have a multi-layer structure including two layers including the organic material and a barrier layer including an inorganic material located between the layers. The mother substrate MP may have a single-layer structure or the multi-layer structure.

The mother substrate MP may include the first display panel area DPA1 located inside the first to fourth cutting lines LCL1, LCL2, LCL3, and LCL4 to which the laser is irradiated and the dummy area DMA surrounding the first display panel area DPA1.

The first heat dissipation pattern HDP1 may overlap the first display panel area DPA1 and the dummy area DMA. The first heat dissipation pattern HDP1 may overlap any one of the first to fourth cutting lines LCL1, LCL2, LCL3, and LCL4. In order not to repeat the description, a case in which the first heat dissipation pattern HDP1 extends from the first display panel area DPA1 to the dummy area DMA and overlaps the first cutting line LCL1 will be described. The first heat dissipation pattern HDP1 may not be arranged adjacent to a pad electrode included in the first display panel area DPA1.

Figure 3:
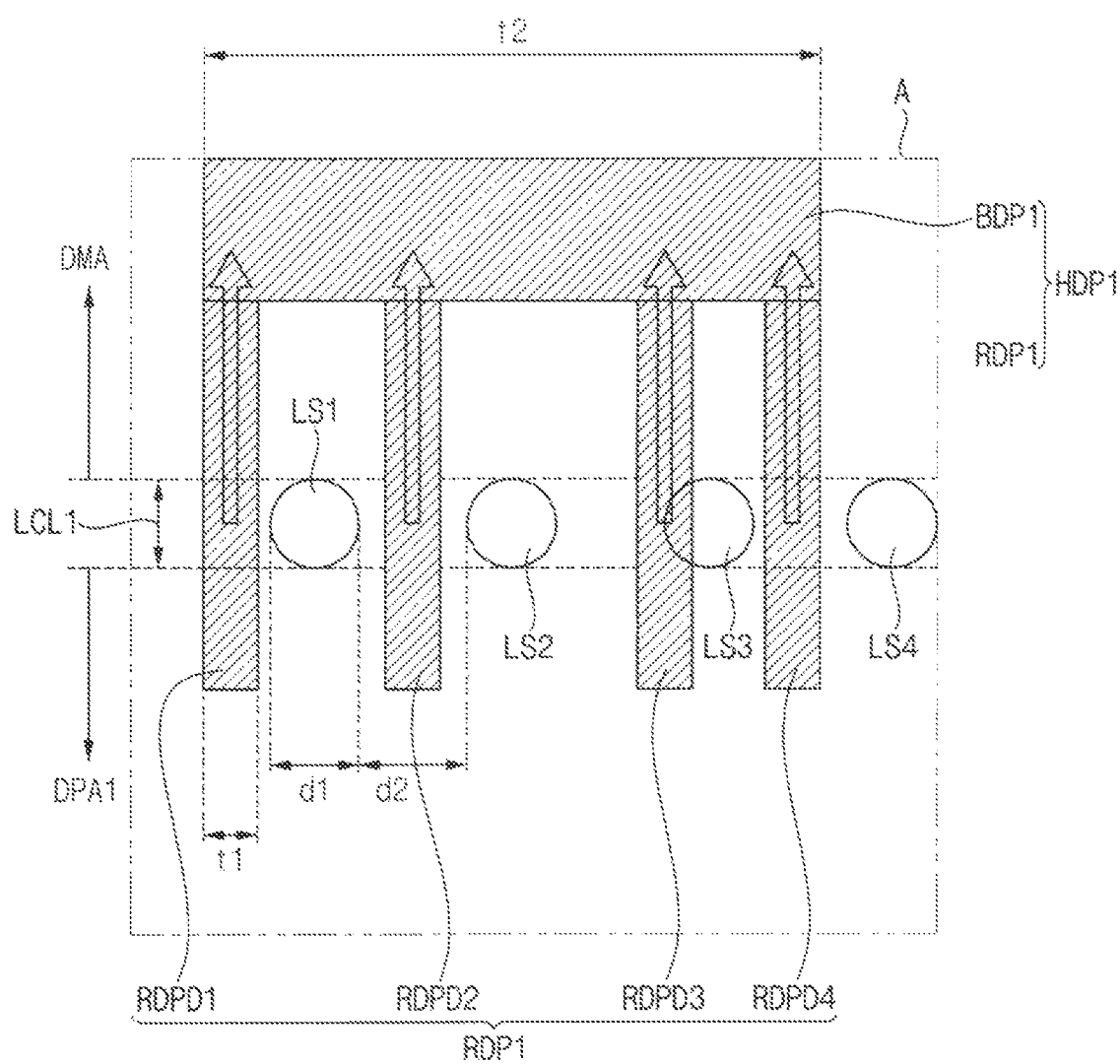
FIG. 3 is an enlarged view illustrating the area CA' of FIG. 2.

FIG. 3 is an enlarged view illustrating the area CA' of FIG. 2.

Referring to FIG. 3, the dummy area DMA and the first display panel area DPA1 may be partitioned along the first cutting line LCL1.

The laser may be irradiated to first to fourth laser spots LS1, LS2, LS3, and LS4 along the first cutting line LCL1. A size d1 of each of the first to fourth laser spots LS1, LS2, LS3, and LS4 may be about 1 μm to about 3 μm. A distance d2 between the first to fourth laser spots LS1, LS2, LS3, and LS4 may be about 1 μm to about 5 μm.

The first heat dissipation pattern HDP1 may include a first rod portion RDP1 and a first body portion BDP1. The first rod portion RDP1 may be arranged on the mother substrate MP and may extend from the first display panel area DPA1 to the dummy area DMA to overlap the first cutting line LCL1. The first body portion BDP1 may be located in the dummy area DMA on the mother substrate MP and may contact the first rod portion RDP1.

The first rod portion RDP1 may include first to fourth lower rods RDPD1, RDPD2, RDPD3, and RDPD4. The first to fourth lower rods RDPD1, RDPD2, RDPD3, and RDPD4 may be spaced apart from each other. Although the first rod portion RDP1 is illustrated as including four lower rods, the number of the lower rods is not limited thereto. For example, the number of the lower rods may be several (e.g., any suitable number according to the design). The first rod portion RDP1 may extend in a direction perpendicular to the cutting line (LCL1, LCL2, LCL3, and LCL4 of FIG. 1) to contact the first body portion BDP1. According to some embodiments, the first rod portion RDP1 may extend in the direction perpendicular to the first cutting line LCL1 to contact the first body portion BDP1. For example, when the first heat dissipation pattern HDP1 is arranged at a position overlapping the second cutting line LCL2, an extending direction of the first rod portion RDP1 may be a direction perpendicular to the second cutting line LCL2.

During laser cutting, the first rod portion RDP1 may reflect the laser and may interfere with the laser cutting. For example, because the first, second, and fourth lower rods RDPD1, RDPD2, and RDPD4 do not overlap the first to fourth laser spots LS1, LS2, LS3 and LS4, the first, second, and fourth lower rods RDPD1, RDPD2, and RDPD4 may not reflect the laser. However, because the third lower rod RDPD3 overlaps the third laser spot LS3, the third lower rod RDPD3 may reflect the laser and may interfere with the laser cutting.

A width t1 of each of the first rod portion RDP1 may be smaller than a width t2 of the first body portion BDP1. The width t1 of each of the first rod portion RDP1 may be, for example, about 5 μm or less. The first rod portion RDP1 may be formed finely or narrowly, thereby reducing or minimizing the possibility that the first rod portion RDP1 overlaps the laser spots LS1, LS2, LS3, and LS4 to interfere with the laser cutting. According to some embodiments, the width t1 of each of the first to fourth lower rods RDPD1, RDPD2, RDPD3, and RDPD4 may be the same. The width t1 of each of the first to fourth lower rods RDPD1, RDPD2, RDPD3, and RDPD4 is not limited, and according to some embodiments, the widths may be different from each other.

The first body portion BDP1 may contact the first to fourth lower rods RDPD1, RDPD2, RDPD3, and RDPD4. The first body portion BDP1 may connect the first to fourth lower rods RDPD1, RDPD2, RDPD3, and RDPD4 to each other. The first rod portion RDP1 may include the same material as the first body portion BDP1. For example, when the first heat dissipation pattern HDP1 includes aluminum, the first rod portion RDP1 and the first body portion BDP1 may include aluminum. An area overlapping the dummy area DMA of the first rod portion RDP1 may be greater than an area overlapping the first display panel area DPA1 of the first rod portion RDP1. An area of the first body portion BDP1 may be greater than an area of each of the first to fourth lower rods RDPD1, RDPD2, RDPD3, and RDPD4. The area of the first body portion BDP1 on a plane may be greater than the area of each of the first to fourth lower rods RDPD1, RDPD2, RDPD3, and RDPD4 on the plane. Accordingly, heat generated during laser cutting may be transmitted to the dummy area DMA. An amount of heat transmitted to the first display panel area DPA1 may be minimized or reduced.

Because heat may be evenly distributed in the first heat dissipation pattern HDP1, the amount of heat transmitted to the first display panel area DPA1 may be less than an amount of heat transmitted to the dummy area DMA. For example, because an overlapping area of the third lower rod RDPD3 with the dummy area DMA is greater than an overlapping area of the third lower rod RDPD3 with the first display panel area DPA1, heat generated from the third laser spot LS3 may be transmitted toward the dummy area DMA through the third lower rod RDPD3. The third lower rod RDPD3 contacts the first body portion BDP1 having an area greater than an area of the third lower rod RDPD3, so that heat generated from the third laser spot LS3 may be further transmitted toward the dummy area DMA through the third lower rod RDPD3.

During laser cutting, heat may be generated along the first cutting line LCL1 by the laser irradiated to the first to fourth laser spots LS1, LS2, LS3 and LS4. The generated heat may be transmitted to the first display panel area DPA1. The heat transmitted to the first display panel area DPA1 may damage organic layers included in the first display panel area DPA1. The first rod portion RDP1 including a material having high thermal conductivity (e.g. metal) is arranged to overlap the first cutting line LCL1, so that the heat may transmitted along the first rod portion RDP1. The heat may be uniformly transmitted to all of the first rod portion RDP1. Because an overlapping area of the first rod portion RDP1 with the dummy area DMA is greater than an overlapping area of the first rod portion RDP1 with the first display panel area DPA1, most of the heat may be transmitted in a direction of an arrow shown. An amount of the heat transmitted to the dummy area DMA may be greater than an amount of the heat transmitted to the first display panel area DPA1. Because the first rod portion RDP1 contacts the first body portion BDP1 and includes the same material as the first body portion BDP1, the heat may be relatively evenly transmitted to the first heat dissipation pattern HDP1. The heat may be more transmitted in a direction toward the dummy area DMA than in a direction toward the first display panel area DPA1. Because the first heat dissipation pattern HDP1 includes the first body portion BDP1 having a large width, a heat dissipation effect reducing the amount of heat transmitted to the first display panel area DPA1 may be increasing. Because the first heat dissipation pattern HDP1 includes the first rod portion RDP1 having a small width, it is possible to decrease the possibility of interfering with the laser cutting by reflecting the laser. Damage caused by heat to the organic layer included in the first display panel area DPA1 may be reduced. The display device including the display panel finally manufactured in the first display panel area DPA1 may have improved display quality. Process reliability of the mother panel 100 may be improved.

Figure 4:
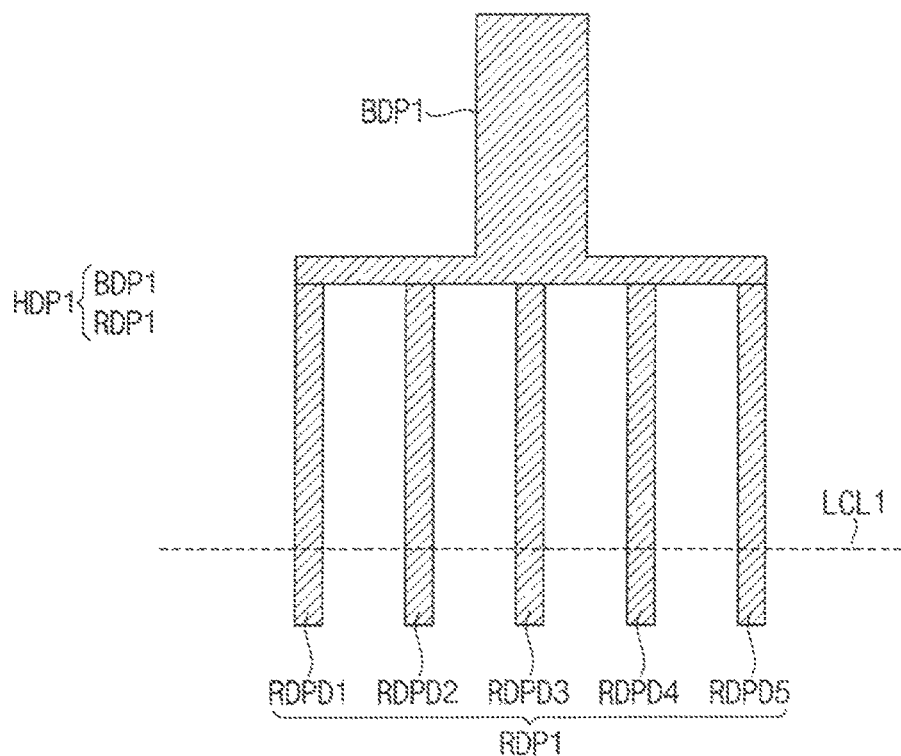
FIG. 4 is an enlarged view illustrating a first heat dissipation pattern of FIG. 1 according to some embodiments.

FIG. 4 is an enlarged view illustrating a first heat dissipation pattern of FIG. 1 according to some embodiments.

Referring to FIG. 4, the first heat dissipation pattern HDP1 may include a first rod portion RDP1 including a plurality of lower rods RDPD1, RDPD2, RDPD3, RDPD4, and RDPD5 overlapping the first cutting line LCL1 and spaced apart from each other and a first body portion BDP1 contacting the first rod portion RDP1. The first rod portion RDP1 may extend in a direction perpendicular to the first cutting line LCL1 to contact the first body portion BDP1. However, the direction in which the first rod portion RDP1 extends is not limited, and it may be sufficient if the first rod portion RDP1 extends and contacts the first body portion BDP1.

Figure 5:
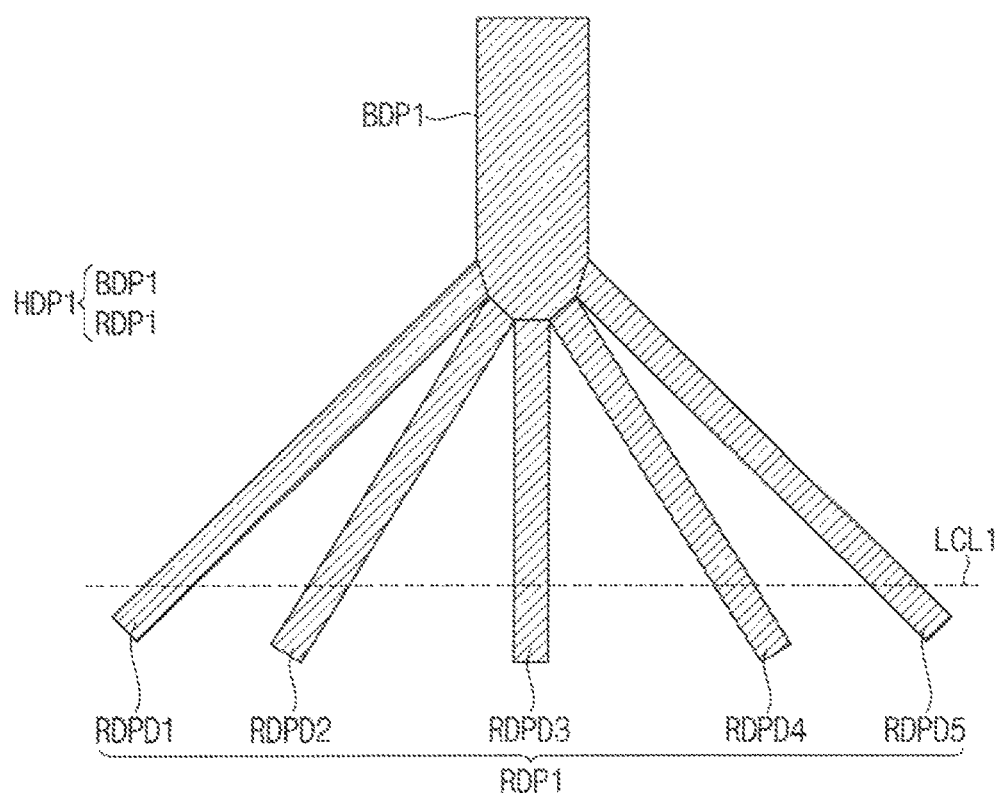
FIG. 5 is an enlarged view illustrating a first heat dissipation pattern of FIG. 1 according to some embodiments.

FIG. 5 is an enlarged view illustrating a first heat dissipation pattern of FIG. 1 according to some embodiments.

Referring to FIG. 5, the first heat dissipation pattern HDP1 may include a first rod portion RDP1 including a plurality of the lower rods RDPD1, RDPD2, RDPD3, RDPD4, and RDPD5 overlapping the first cutting line LCL1 and spaced apart from each other and a first body portion BDP1 contacting the first rod portion RDP1. At least two of the first rod portion RDP1 may extend in different directions to contact the first body portion BDP1. For example, an extending direction of the first lower rod RDPD1 may be different from an extending direction of the second lower rod RDPD2. However, the directions in which the first rod portion RDP1 extends are not limited, and it may be sufficient if the first rod portion RDP1 extends and contacts the first body portion BDP1.

Figure 6:
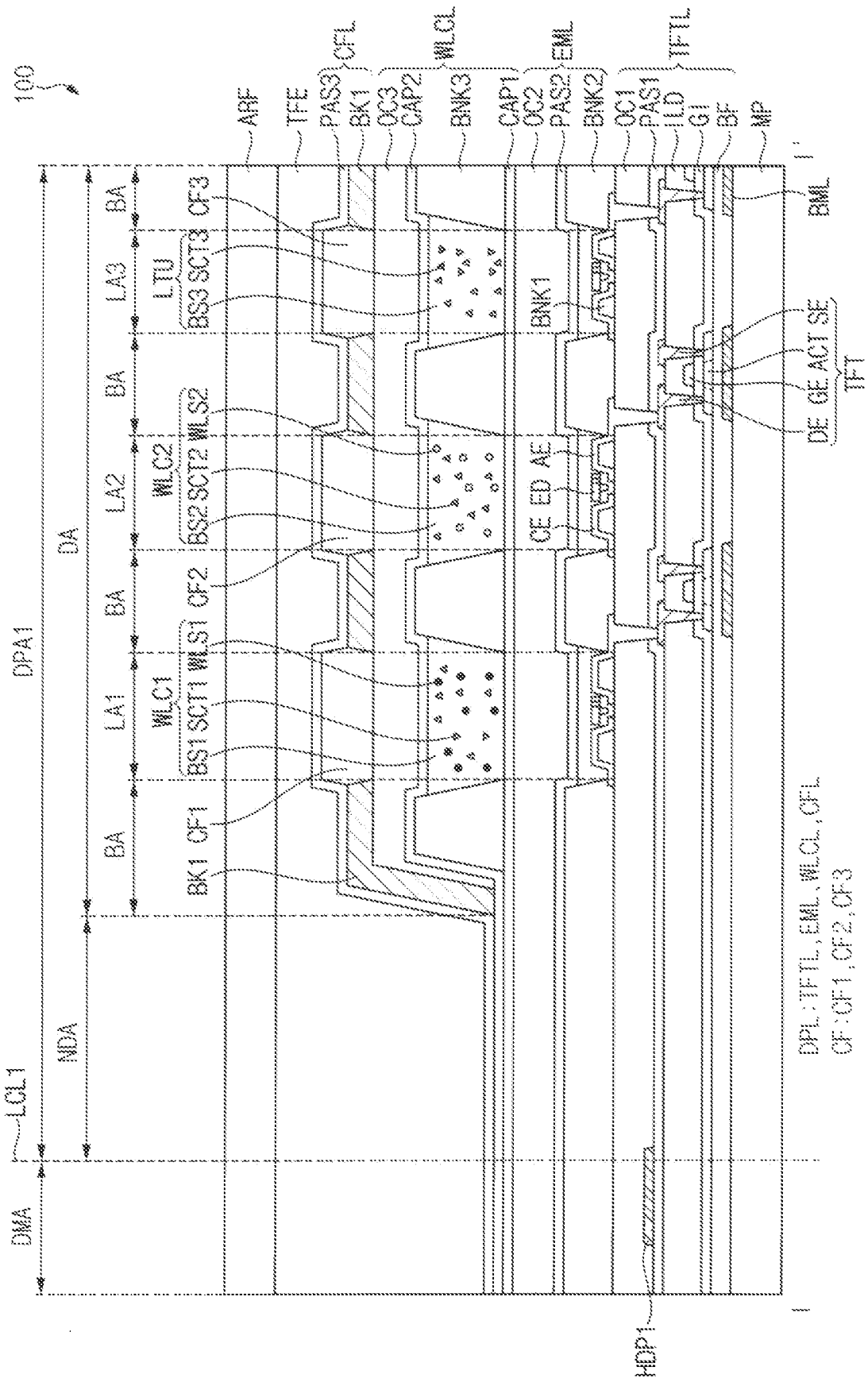
FIG. 6 is a cross-sectional view according to some embodiments taken along the line I-I' of FIG. 1.

FIG. 6 is a cross-sectional view according to some embodiments taken along the line I-I' of FIG. 1.

Referring to FIGS. 1 and 6, the mother panel 100 may include the first display panel area DPA1 including the display area DA and the non-display area NDA, and the dummy area DMA. The display area DA may be an area in which light generated by a light emitting diode ED of the first display panel area DPA1 is emitted to an outside.

The mother panel 100 may include the mother substrate MP, a display layer DPL, an encapsulation layer TFE, and an anti-reflection film ARF.

The display layer DPL may be arranged on the mother substrate MP in the first display panel area DPA1. The display layer DPL may include a transistor layer TFTL, a light emitting diode layer EML, a wavelength conversion layer WLCL, and a color filter layer CFL. The transistor layer TFTL may include a metal layer BML, a buffer layer BF, a transistor TFT, a gate insulating layer GI, an interlayer insulating layer ILD, a first passivation layer PAS1, and a first planarization layer OC1.

The metal layer BML may be arranged on the mother substrate MP. The metal layer BML may overlap the transistor TFT to block external light incident on the transistor TFT. For example, the metal layer BML may include at least one selected from the group consisting of molybdenum (Mo), aluminum (Al), chromium (Cr), gold (Au), titanium (Ti), nickel (Ni), neodymium (Nd), and copper (Cu).

The buffer layer BF may be arranged on the metal layer BML. The buffer layer BF may cover the metal layer BML and the mother substrate MP. The buffer layer BF may include an inorganic material preventing or reducing penetration of air or moisture. The buffer layer BF may extend from the first display panel area DPA1 to the dummy area DMA.

The transistor TFT may be arranged on the buffer layer BF. The transistor TFT may include an active layer ACT, a gate electrode GE, and a connection electrode. The connection electrode may include a drain electrode DE and a source electrode SE. For example, the transistor TFT may be a driving transistor or a switching transistor of a pixel circuit.

The active layer ACT may be arranged on the buffer layer BF. The active layer ACT may overlap the metal layer BML.

The gate insulating layer GI may be arranged on the active layer ACT. The gate insulating layer GI may cover the active layer ACT and the buffer layer BF. The gate insulating layer GI may include an inorganic insulating material that insulates the active layer ACT and the gate electrode GE. The gate insulating layer GI may extend from the first display panel area DPA1 to the dummy area DMA.

The gate electrode GE may be arranged on the gate insulating layer GI. The gate electrode GE may overlap the active layer ACT with the gate insulating layer GI interposed therebetween.

The interlayer insulating layer ILD may be arranged on the gate electrode GE. The interlayer insulating layer ILD may include an inorganic insulating material that insulates the gate electrode GE and the connection electrode. The interlayer insulating layer ILD may extend from the first display panel area DPA1 to the dummy area DMA.

The drain electrode DE and the source electrode SE may be arranged to be spaced apart from each other on the interlayer insulating layer ILD. The source electrode SE may connect a data line or a power line to the active layer ACT of the transistor TFT. The drain electrode DE may be connected to the active layer ACT of the transistor TFT.

The first passivation layer PAS1 may be located on the drain electrode DE and the source electrode SE. The first passivation layer PAS1 may cover the drain electrode DE, the source electrode SE, and the interlayer insulating layer ILD. The first passivation layer PAS1 may protect the transistor TFT. The first passivation layer PAS1 may extend from the first display panel area DPA1 to the dummy area DMA.

The first planarization layer OC1 may be arranged on the first passivation layer PAS1. The first planarization layer OC1 may planarize a top surface of the transistor layer TFTL. The first planarization layer OC1 may include an organic material. For example, the first planarization layer OC1 may include a photoresist, a polyacrylic resin, a polyimide-based resin, and the like. Accordingly, the first planarization layer OC1 may be referred to as an organic layer. The first planarization layer OC1 may extend from the first display panel area DPA1 to the dummy area DMA.

The light emitting diode layer EML may include a first electrode AE, a second electrode CE, a light emitting diode ED, a first bank BNK1, a second bank BNK2, a second passivation layer PAS2, and a second planarization layer OC2.

The first electrode AE may be arranged on the first planarization layer OC1. The first electrode AE may be arranged on the first bank BNK1 located on the first planarization layer OC1. The first electrode AE may be connected to the active layer ACT of the transistor TFT through the drain electrode DE. The first electrode AE may be an anode electrode of the light emitting diode ED, but the present disclosure is not limited thereto.

The second electrode CE may be located on the first planarization layer OC1. The second electrode CE may be spaced apart from the first electrode AE. The second electrode CE may be arranged on the first bank BNK1 arranged on the first planarization layer OC1. For example, the second electrode CE may receive a low potential voltage supplied to a pixel from a low potential (or low voltage) line. The second electrode CE may be a cathode electrode of the light emitting diode ED, but embodiments according to the present disclosure are not limited thereto.

The light emitting diode ED may be located between the first electrode AE and the second electrode CE on the first planarization layer OC1. One end of the light emitting diode ED may be connected to the first electrode AE, and another end of the light emitting diode ED may be connected to the second electrode CE. The light emitting diode ED may be an inorganic light emitting diode including an inorganic material. The light emitting diode ED may emit blue light.

The second bank BNK2 may be located on the first planarization layer OC1. The second bank BNK2 may define an area where one light emitting diode ED emits light. The second bank BNK may extend from the first display panel area DPA1 to the dummy area DMA.

The second passivation layer PAS2 may be arranged on the light emitting diode ED. The second passivation layer PAS2 may cover the light emitting diode ED and the second bank BNK2. The second passivation layer PAS2 may prevent or reduce penetration of impurities such as moisture or air from the outside to prevent or reduce damage to the light emitting diode ED. The second passivation layer PAS2 may extend from the first display panel area DPA1 to the dummy area DMA.

The second planarization layer OC2 may be arranged on the second passivation layer PAS2. The second planarization layer OC2 may planarize an upper surface of the light emitting diode layer EML. The second planarization layer OC2 may include an organic material. For example, the second planarization layer OC2 may include a photoresist, a polyacrylic resin, a polyimide-based resin, and the like. Accordingly, the second planarization layer OC2 may be referred to as an organic layer. The second planarization layer OC2 may extend from the first display panel area DPA1 to the dummy area DMA.

The wavelength conversion layer WLCL may include a first capping layer CAP1, a third bank BNK3, a first wavelength conversion part WLC1, a second wavelength conversion part WLC2, a light transmitting part LTU, and a second capping layer CAP2, and a third planarization layer OC3.

The first capping layer CAP1 may be arranged on the second planarization layer OC2. The first capping layer CAP1 may seal lower surfaces of the first and second wavelength conversion parts WLC1 and WLC2 and the light transmitting part LTU. The first capping layer CAP1 may include an inorganic material. The first capping layer CPA1 may extend from the first display panel area DPA1 to the dummy area DMA.

The third bank BNK3 may be arranged on the first capping layer CAP1. The third bank BNK3 may overlap the second bank BNK2. The third bank BNK3 may block light transmission. The third bank BNK3 may prevent or reduce instances of light emitted from the adjacent light emitting diodes ED invading and mixing colors.

The first wavelength conversion part WLC1 may be arranged on the first capping layer CAP1. The first wavelength conversion part WLC1 may be surrounded by the third bank BNK3. The first wavelength conversion part WLC1 may include a first base resin BS1, a first scatterer SCT1, and a first wavelength shifter WLS1.

The first base resin BS1 may include a material having high light transmittance. The first base resin BS1 may include a transparent organic material.

The first scatterer SCT1 may have a refractive index different from a refractive index of the first base resin BS1 and may form an optical interface with the first base resin BS1. The first scatterer SCT1 may include a light scattering material that scatters at least a portion of transmitted light. For example, the first scatterer SCT1 may include metal oxide such as titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$) or may include organic particles such as an acrylic resin or a urethane-based resin. The first scatterer SCT1 may scatter light in a random direction irrespective of an incident direction of an incident light, without substantially converting a peak wavelength of the incident light.

The first wavelength shifter WLS1 may convert the peak wavelength of the incident light into a first peak wavelength. For example, the first wavelength shifter WLS1 may convert blue light emitted by the light emitting diode ED into red light having a single peak wavelength in a range of about 610 nm to about 650 nm and emit it. The first wavelength shifter WLS1 may be a quantum dot, a quantum rod, or a phosphor.

A portion of a blue light provided from the light emitting diode layer EML may pass through the first wavelength conversion part WLC1 without being converted into red light by the first wavelength shifter WLS1. Among the blue light provided from the light emitting diode layer EML, the light incident on a first color filter CF1 without being converted by the first wavelength conversion part WLC1 may be blocked by the first color filter CF1. Red light converted by the first wavelength conversion part WLC1 among the blue light provided by the light emitting diode layer EML may pass through the first color filter CF1 and be emitted to the outside.

The second wavelength conversion part WLC2 may be located on the first capping layer CAP1. The second wavelength conversion part WLC2 may be surrounded by the third bank BNK3. The second wavelength conversion part WLC2 may include a second base resin BS2, a second scatterer SCT2, and a second wavelength shifter WLS2.

The second base resin BS2 may include a material having high light transmittance. The second base resin BS2 may include a transparent organic material. For example, the second base resin BS2 may include the same material as the first base resin BS1.

The second scatterer SCT2 may have a refractive index different from a refractive index of the second base resin BS2 and may form an optical interface with the second base resin BS2. The second scatterer SCT2 may include a light scattering material that scatters at least a portion of transmitted light. For example, the second scatterer SCT2 may include the same material as the first scatterer SCT1 or may include the material illustrated in the first scatterer SCT1.

The second wavelength shifter WLS2 may convert a peak wavelength of an incident light into a second peak wavelength different from the first peak wavelength of the first wavelength shifter WLS1. For example, the second wavelength shifter WLS2 may convert blue light emitted by the light emitting diode ED into green light having a single peak wavelength in a range of about 510 nm to about 550 nm and emit it. The second wavelength shifter WLS2 may be a quantum dot, a quantum rod, or a phosphor.

The light transmitting part LTU may be located on the first capping layer CAP1. The light transmitting part LTU may be surrounded by the third bank BNK3. The light transmitting part LTU may transmit an incident light while maintaining a peak wavelength. The light transmitting part LTU may include a third base resin BS3 and a third scatterer SCT3.

The third base resin BS3 may include a material having high light transmittance. The third base resin BS3 may include a transparent organic material. For example, the third base resin BS3 may include the same material as the first and second base resins BS1 and BS2.

The third scatterer SCT3 may have a refractive index different from a refractive index of the third base resin BS3 and may form an optical interface with the third base resin BS3. For example, the third scatterer SCT3 may include a light scattering material or light scattering particles that scatter at least a portion of transmitted light. For example, the third scatterer SCT3 may include the same material as the first and second scatterers SCT1 and SCT2 or may include the material illustrated in the first scatterer SCT1.

The wavelength conversion layer WLCL may be directly located on the second planarization layer OC2 of the light emitting diode layer EML.

The second capping layer CAP2 may be located on the first and second wavelength conversion parts WLC1 and WLC2, the light transmitting part LTU, and the third bank BNK3 in the display area DA. The second capping layer CAP2 may cover an outermost side of the third bank BNK3 in the display area DA and may be located on the first capping layer CAP1 in the non-display area NDA. For example, the second capping layer CAP2 seals the first and second wavelength conversion parts WLC1 and WLC2 and the light transmitting part LTU, so that the second capping layer CAP2 may prevent or reduce damage or contamination of the first and second wavelength conversion parts WLC1 and WLC2 and the light transmitting part LTU. For example, the second capping layer CAP2 may include an inorganic material. The second capping layer CPA2 may extend from the first display panel area DPA1 to the dummy area DMA.

The third planarization layer OC3 may be located on the second capping layer CAP2. The third planarization layer OC3 may planarize top surfaces of the first and second wavelength conversion parts WLC1 and WLC2 and the light transmitting part LTU. For example, the third planarization layer OC3 may include an organic material.

The color filter layer CFL may include a first light blocking member BK1, first to third color filters CF1, CF2, and CF3, and a third passivation layer PAS3.

The first light blocking member BK1 may be located on the third planarization layer OC3. The first light blocking member BK1 may overlap the third bank BNK3 or the second bank BNK2. The first light blocking member BK1 may cover a side surface of the third planarization layer OC3 outside the display area DA. The first light blocking member BK1 arranged at an outermost of the first light blocking member BK1 may surround a side surface of the wavelength conversion layer WLCL. The first light blocking member BK1 may block light transmission. For example, the first light blocking member BK1 may include an organic black pigment, but embodiments according to the present disclosure are not limited thereto.

The first color filter CF1 may be located on the first wavelength conversion part WLC1 on the third planarization layer OC3. The first color filter CF1 may be surrounded by the first light blocking member BK1. The first color filter CF1 may selectively transmit light of a first color (e.g. red light), and may be blocked or absorbed light of a second color (e.g. green light) and light of a third color (e.g. blue light). For example, the first color filter CF1 may be a red color filter and may include a red colorant.

The second color filter CF2 may be located on the second wavelength conversion part WLC2 on the third planarization layer OC3. The second color filter CF2 may be surrounded by the first light blocking member BK1. The second color filter CF2 may selectively transmit light of the second color (e.g. green light), and may be blocked or absorbed light of the first color (e.g. red light) and light of the third color (e.g. blue light). For example, the second color filter CF2 may be a green color filter and may include a green colorant.

The third color filter CF3 may be arranged on the light transmitting part LTU on the third planarization layer OC3. The third color filter CF3 may be surrounded by the first light blocking member BK1. The third color filter CF3 may selectively transmit light of the third color (e.g. blue light), and may be blocked or absorbed light of the first color (e.g. red light) and light of the second color (e.g. green light). For example, the third color filter CF3 may be a blue color filter and may include a blue colorant.

The first to third color filters CF1, CF2, and CF3 may absorb a portion of external light to reduce reflected light due to external light. Accordingly, the first to third color filters CF1, CF2, and CF3 may prevent or reduce color distortion due to reflection of external light.

The first to third color filters CF1, CF2, and CF3 may be directly arranged on the third planarization layer OC3 of the wavelength conversion layer WLCL.

The third passivation layer PAS3 may be arranged on the first to third color filters CF1, CF2, and CF3. The third passivation layer PAS3 may cover the first light blocking member BK1 and the first to third color filters CF1, CF2, and CF3 in the display area DA, and may cover the second capping layer CAP2 in the non-display area NDA. The third passivation layer PAS3 may protect the first to third color filters CF1, CF2, and CF3. The third passivation layer PAS3 may extend from the first display panel area DPA1 to the dummy area DMA.

The encapsulation layer TFE may be arranged on the third passivation layer PAS3. The encapsulation layer TFE may include at least one inorganic layer to prevent or reduce penetration of air or moisture. Also, the encapsulation layer TFE may include at least one organic layer to planarize an upper surface of the color filter layer CFL and may protect the mother panel 100 from foreign substances. Accordingly, the encapsulation layer TFE may include an organic layer.

The anti-reflection film ARF may be arranged on the encapsulation layer TFE. The anti-reflection film ARF may reduce a decrease in visibility due to reflection of external light by preventing or reducing reflection of external light. The anti-reflection layer ARF may be omitted according to some embodiments. According to some embodiments, the anti-reflection film ARF may be replaced with a polarizing film.

According to some embodiments, the first heat dissipation pattern HDP1 may be arranged between the first passivation layer PAS1 and the first planarization layer OC1. The first heat dissipation pattern HDP1 may be arranged under the first planarization layer OC1 that is an organic layer. However, the first heat dissipation pattern HDP1 is not limited to contacting a lower surface of the organic layer.

Heat generated by irradiating the laser to the first cutting line LCL1 may be evenly transmitted to the first heat dissipation pattern HDP1. The amount of heat transmitted to the first display panel area DPA1 may be reduced. Heat damage to the first planarization layer OC1 located in the first display panel area DPA1 and including an organic material may be reduced.

Figure 7:
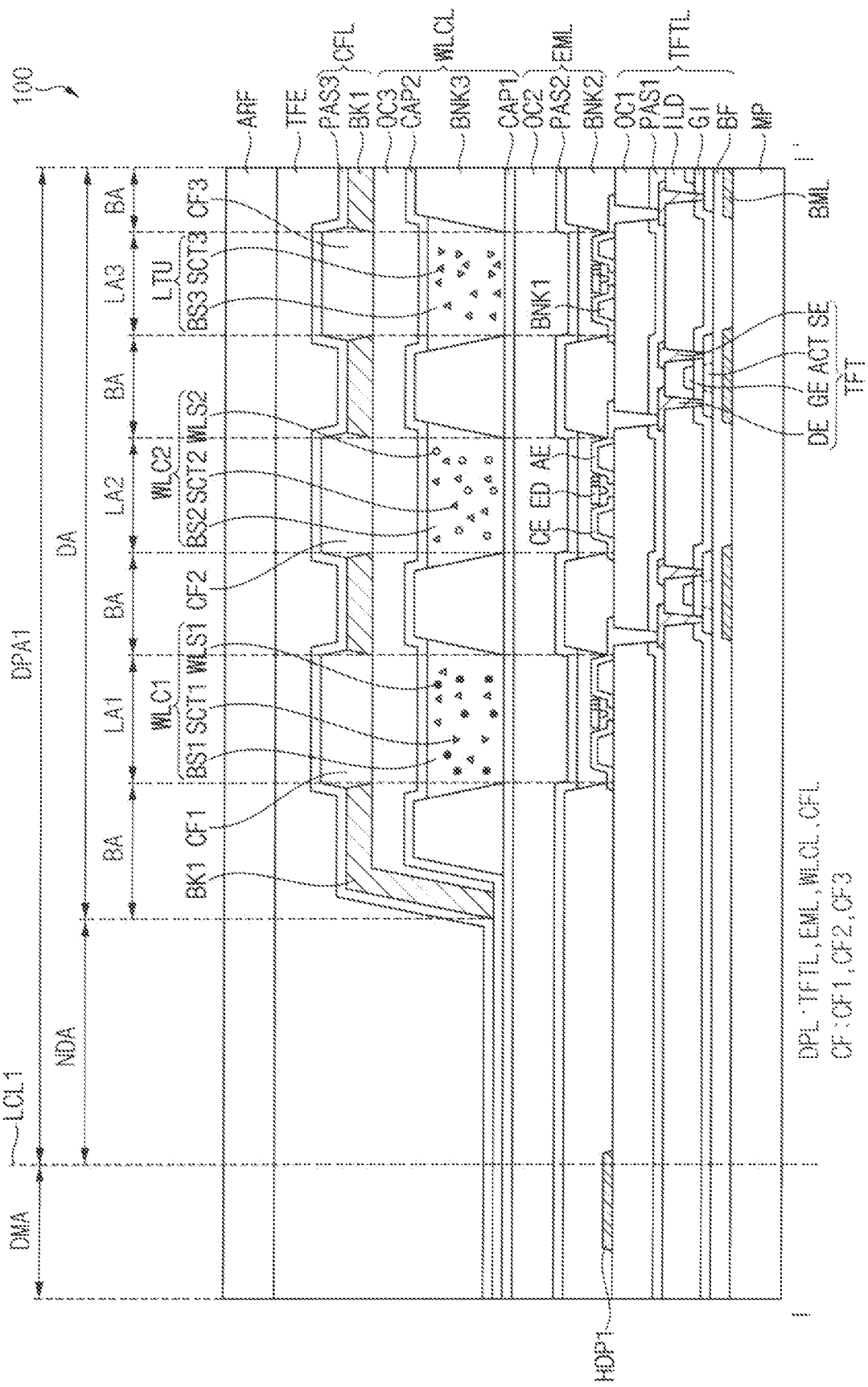
FIG. 7 is a cross-sectional view according to some embodiments taken along the line I-I' of FIG. 1.

FIG. 7 is a cross-sectional view according to some embodiments taken along the line I-I' of FIG. 1. The same reference numerals are used for the same components as in FIG. 6, and some duplicate descriptions of the same components may be omitted.

Referring to FIGS. 1 and 7, the first heat dissipation pattern HDP1 may be located on the first planarization layer OC1. However, the first heat dissipation pattern HDP1 is not limited to contacting a top surface of the organic layer.

The first heat dissipation pattern HDP1 may include the same material as the first electrode AE. The first heat dissipation pattern HDP1 may include the same material as the second electrode CE. The first heat dissipation pattern HDP1 may be formed simultaneously with the first electrode AE and the second electrode CE. Accordingly, the first heat dissipation pattern HDP1, the first electrode AE, and the second electrode CE may be formed using one mask. A separate mask may not be required to form the first heat dissipation pattern HDP1.

Heat generated by irradiating the laser to the first cutting line LCL1 may be evenly transmitted to the first heat dissipation pattern HDP1. The amount of heat transmitted to the first display panel area DPA1 may be reduced. Heat damage to the first planarization layer OC1 located in the first display panel area DPA1 and including an organic material may be reduced.

Figure 8:
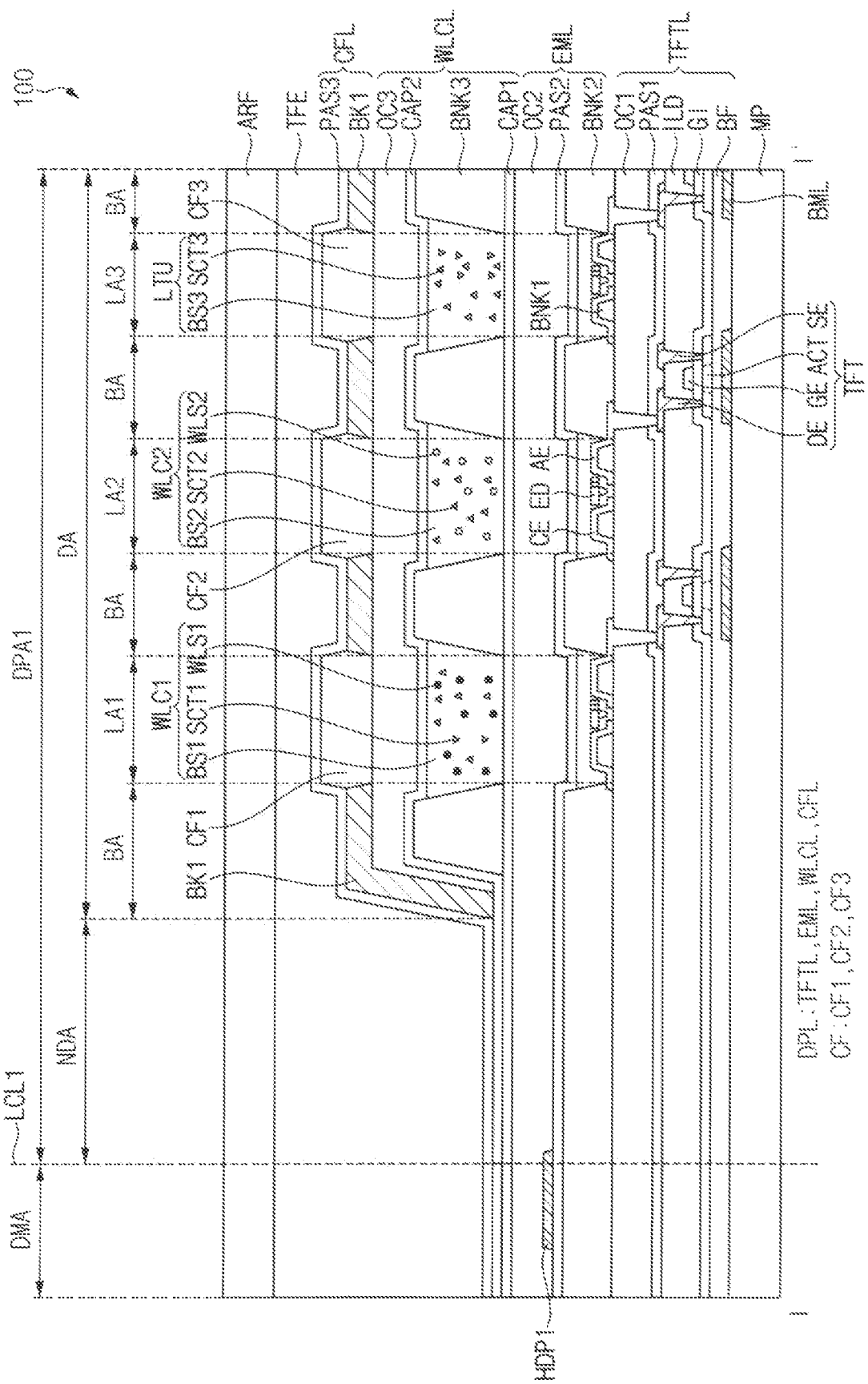
FIG. 8 is a cross-sectional view according to some embodiments taken along the line I-I' of FIG. 1.

FIG. 8 is a cross-sectional view according to some embodiments taken along the line I-I' of FIG. 1. The same reference numerals are used for the same components as in FIG. 6, and some duplicate descriptions of the same components may be omitted.

Referring to FIGS. 1 and 8, the first heat dissipation pattern HDP1 may be located between the second passivation layer PAS2 and the second planarization layer OC2. The first heat dissipation pattern HDP1 may be located under the second planarization layer OC2 which is an organic layer. However, the first heat dissipation pattern HDP1 is not limited to contacting a lower surface of the organic layer.

Heat generated by irradiating the laser to the first cutting line LCL1 may be evenly transmitted to the first heat dissipation pattern HDP1. The amount of heat transmitted to the first display panel area DPA1 may be reduced. Heat damage to the second planarization layer OC2 located in the first display panel area DPA1 and including an organic material may be reduced.

Figure 9:
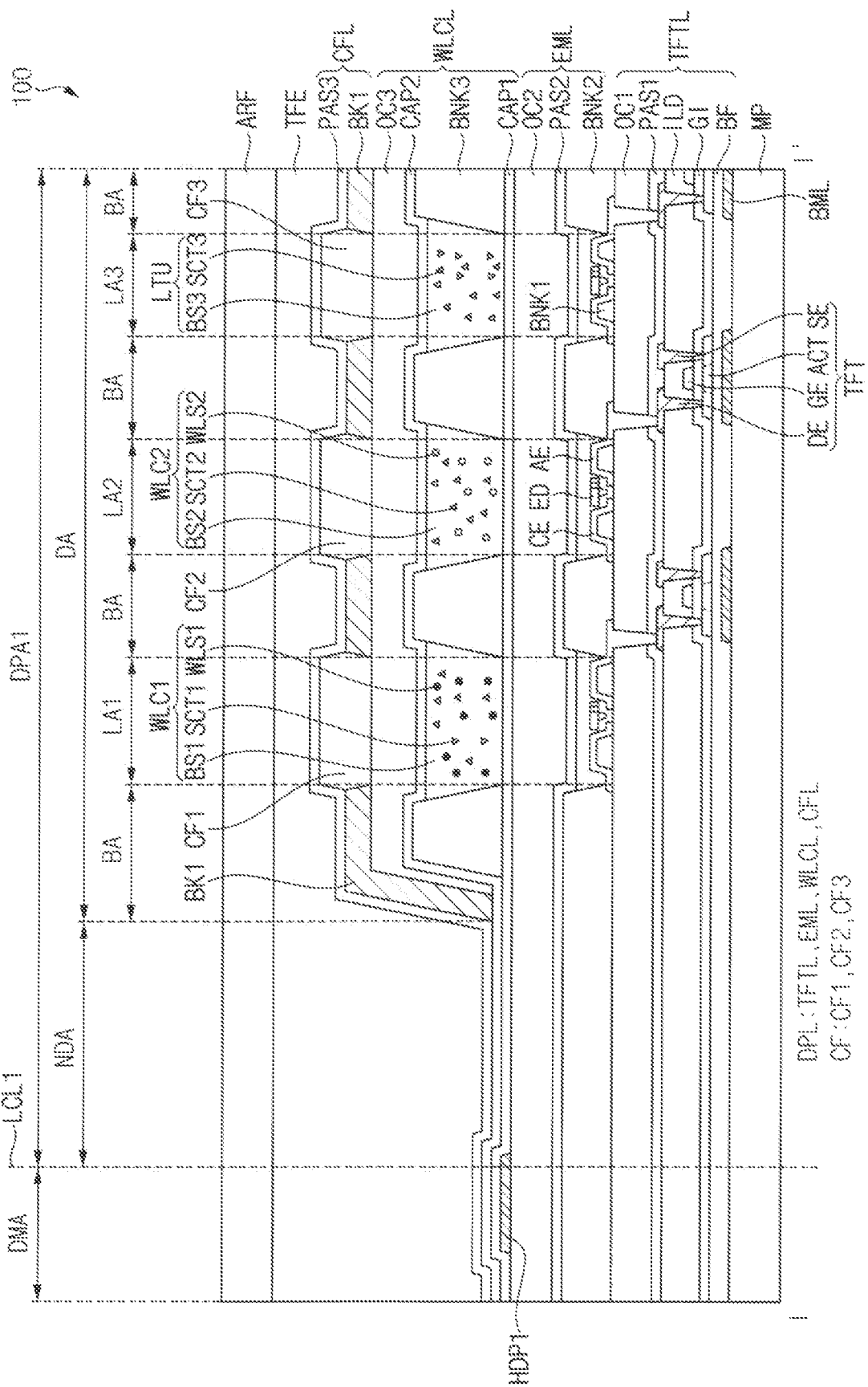
FIG. 9 is a cross-sectional view according to some embodiments taken along the line I-I' of FIG. 1.

FIG. 9 is a cross-sectional view according to some embodiments taken along the line I-I' of FIG. 1. The same reference numerals are used for the same components as in FIG. 6, and some duplicate descriptions of the same components may be omitted.

Referring to FIGS. 1 and 9, the first heat dissipation pattern HDP1 may be located on the second planarization layer OC2. However, the first heat dissipation pattern HDP1 is not limited to contacting a top surface of the organic layer.

Heat generated by irradiating the laser to the first cutting line LCL1 may be evenly transmitted to the first heat dissipation pattern HDP1. The amount of heat transmitted to the first display panel area DPA1 may be reduced. Heat damage to the second planarization layer OC2 located in the first display panel area DPA1 and including an organic material may be reduced.

Figure 10:
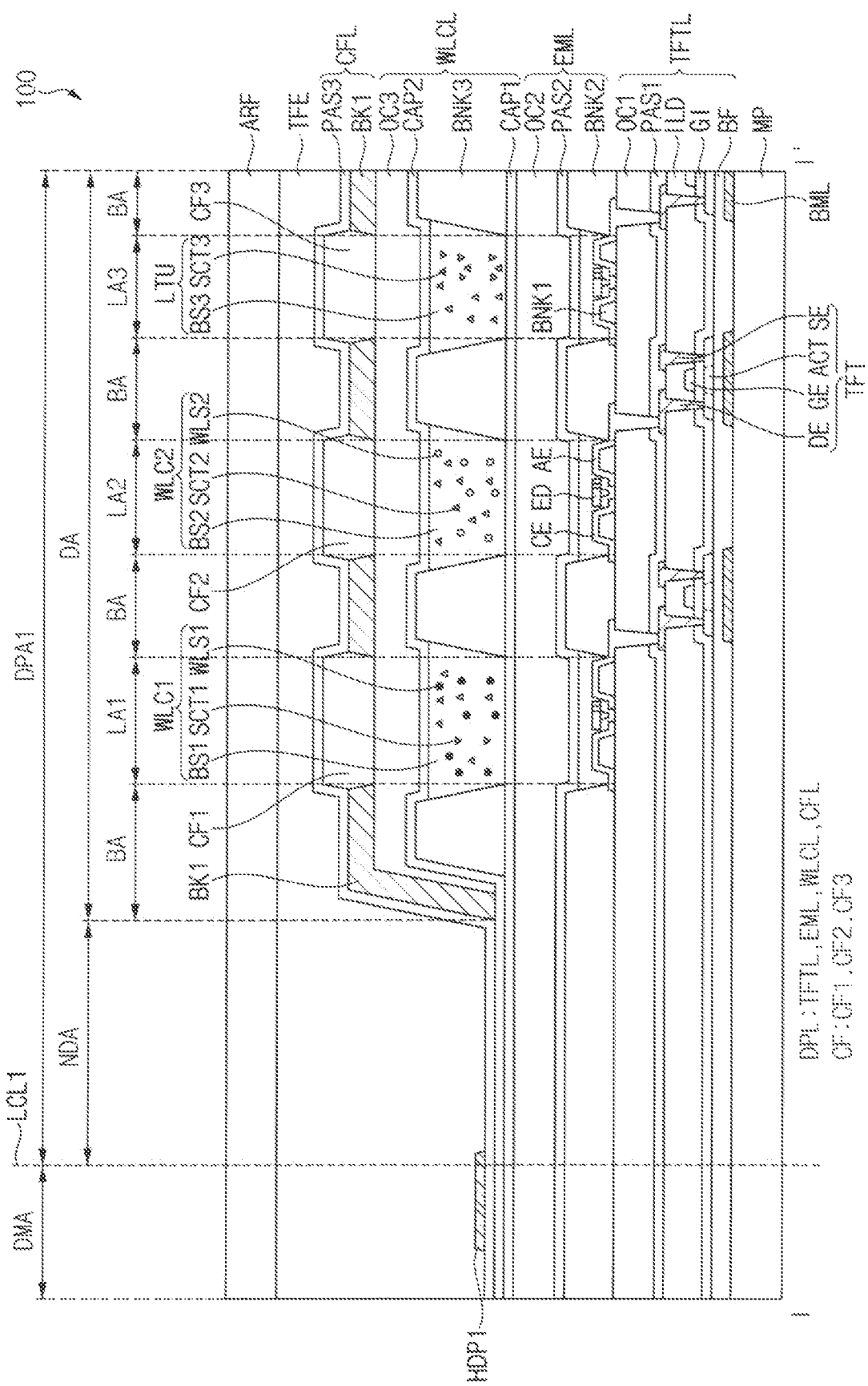
FIG. 10 is a cross-sectional view according to some embodiments taken along the line I-I' of FIG. 1.

FIG. 10 is a cross-sectional view according to some embodiments taken along the line I-I' of FIG. 1. The same reference numerals are used for the same components as in FIG. 6, and some duplicate descriptions of the same components may be omitted.

Referring to FIGS. 1 and 10, the first heat dissipation pattern HDP1 may be located between the third passivation layer PAS3 and the encapsulation layer TFE. The first heat dissipation pattern HDP1 may be arranged under the encapsulation layer TFE including the organic layer.

Heat generated by irradiating the laser to the first cutting line LCL1 may be evenly transmitted to the first heat dissipation pattern HDP1. The amount of heat transmitted to the first display panel area DPA1 may be reduced. Heat damage to the encapsulation later TFE located in the first display panel area DPA1 and including an organic material may be reduced.

Figure 11:
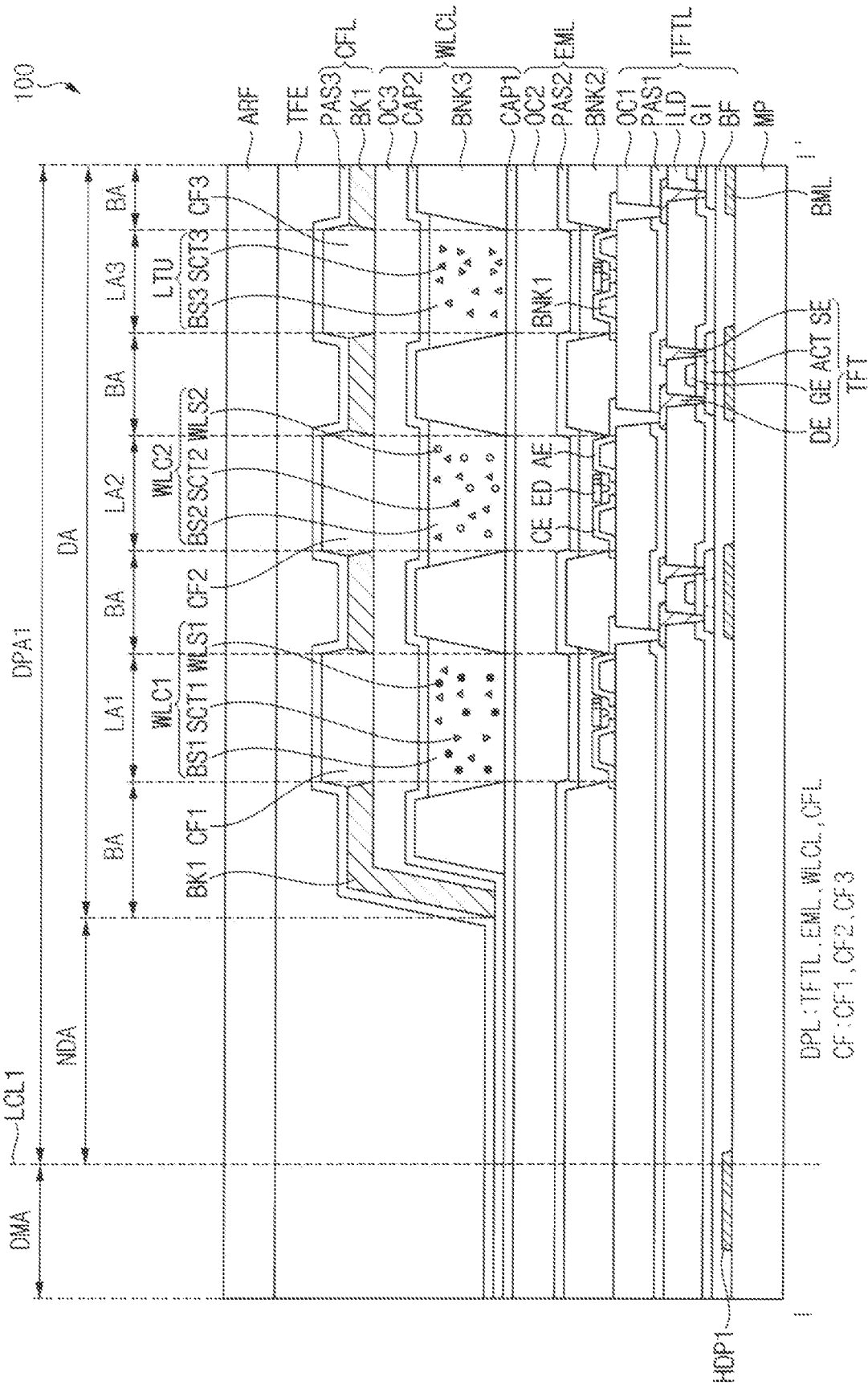
FIG. 11 is a cross-sectional view according to some embodiments taken along the line I-I' of FIG. 1.

FIG. 11 is a cross-sectional view according to some embodiments taken along the line I-I' of FIG. 1. The same reference numerals are used for the same components as in FIG. 6, and some duplicate descriptions of the same components may be omitted.

Referring to FIGS. 1 and 11, the first heat dissipation pattern HDP1 may be arranged on the mother substrate MP. However, the first heat dissipation pattern HDP1 is not limited to contacting an upper surface of the mother substrate MP including the organic layer.

The first heat dissipation pattern HDP1 may include the same material as the metal layer BML. The first heat dissipation pattern HDP1 may be formed simultaneously with the metal layer BML. Accordingly, the first heat dissipation pattern HDP1 and the metal layer BML may be formed using one mask. A separate mask may not be required to form the first heat dissipation pattern HDP1.

Heat generated by irradiating the laser to the first cutting line LCL1 may be evenly transmitted to the first heat dissipation pattern HDP1. The amount of heat transmitted to the first display panel area DPA1 may be reduced. Heat damage to the mother substrate MP located in the first display panel area DPA1 and including an organic material may be reduced.

Figure 12:
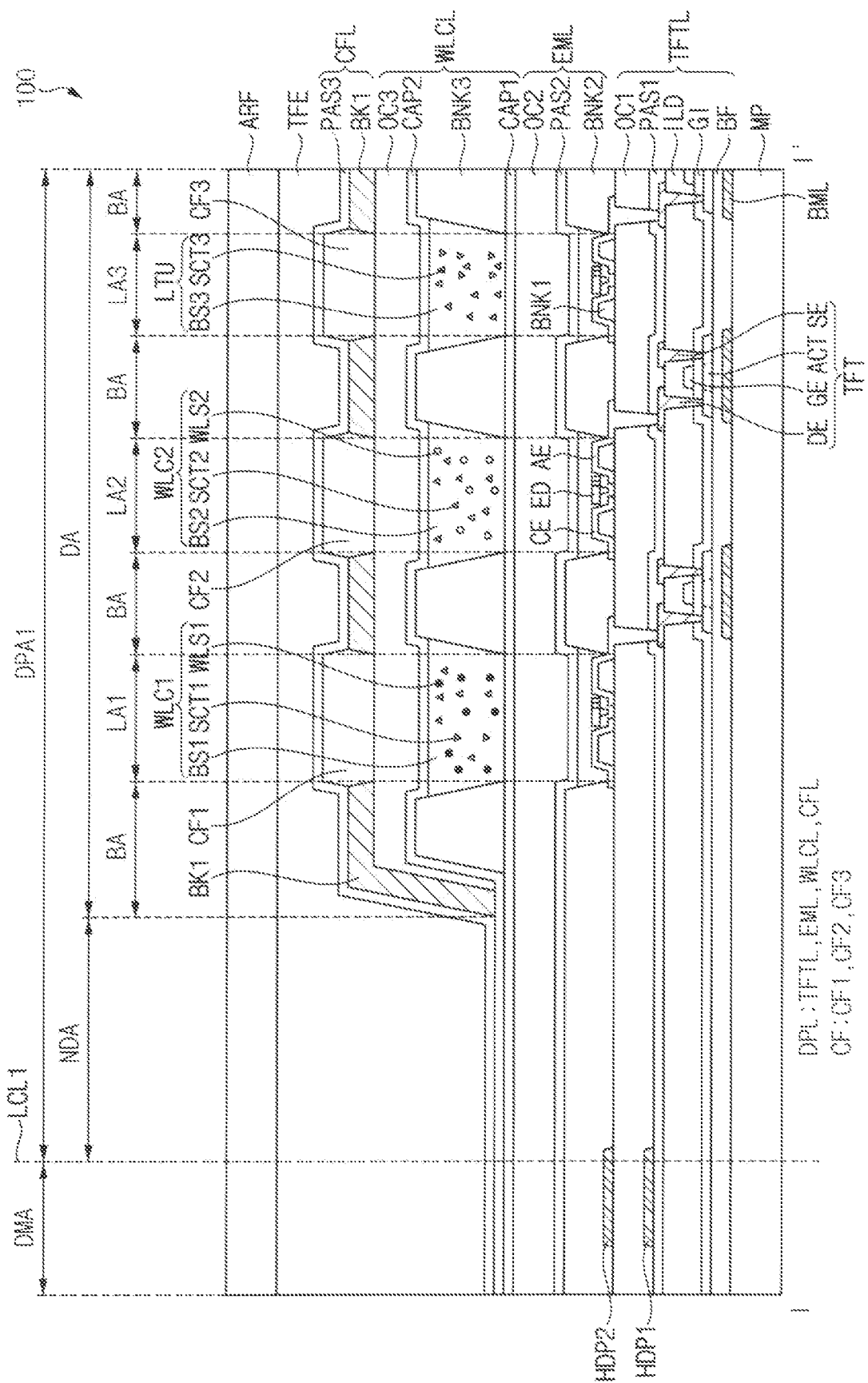
FIG. 12 is a cross-sectional view according to some embodiments taken along the line I-I' of FIG. 1.
Figure 13:
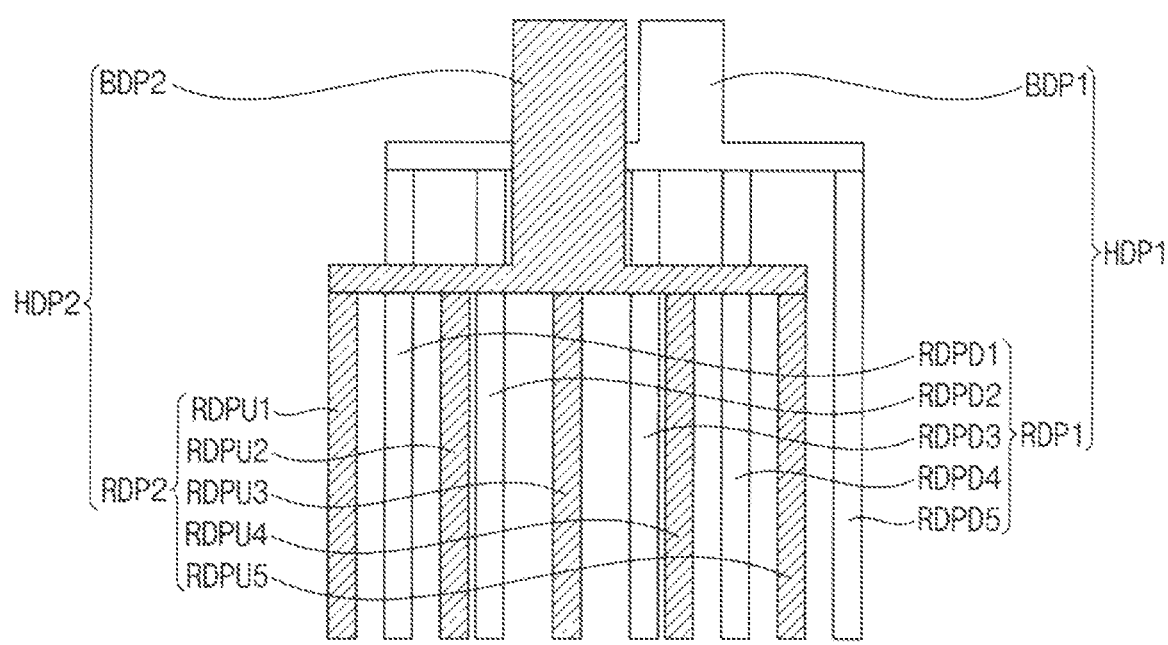
FIG. 13 is a plan view illustrating first and second heat dissipation patterns of FIG. 12.

FIG. 12 is a cross-sectional view according to some embodiments taken along the line I-I' of FIG. 1. FIG. 13 is a plan view illustrating first and second heat dissipation patterns of FIG. 12. The same reference numerals are used for the same components as in FIG. 6, and some duplicate descriptions of the same components may be omitted.

Referring to FIGS. 1, 12, and 13, the mother panel 100 may further include a second heat dissipation pattern HDP2. The second heat dissipation pattern HDP2 may include a second rod portion RDP2 and a second body portion BDP2.

The second rod portion RDP2 may be located on the first rod portion RDP1. The second rod portion RDP2 may include first to fifth upper rods RDPU1, RDPU2, RDPU3, RDPU4, and RDPU5 spaced apart from each other. The first to fifth upper rods RDPU1, RDPU2, RDPU3, RDPU4, and RDPU5 may extend from the first display panel area DPA1 to the dummy area DMA to overlap the first cutting line LCL1.

The first rod portion RDP1 may not overlap the second rod portion RDP2. The first to fifth lower rods RDPD1, RDPD2, RDPD3, RDPD4, and RDPD5 may not overlap the first to fifth upper rods RDPU1, RDPU2, RDPU3, RDPU4, and RDPU5. Because the first rod portion RDP1 and the second rod portion RDP2 do not overlap each other, deterioration of laser cutting quality may be minimized. When the first rod portion RDP1 and the second rod portion RDP2 overlap, a thickness of a metal through which the laser passes may be thick. In this case, because it may interfere with laser cutting, the first rod portion RDP1 may be arranged so as not to overlap the second rod portion RDP2.

The first heat dissipation pattern HDP1 may be located between the first passivation layer PAS1 and the first planarization layer OC1. The first heat dissipation pattern HDP1 may be arranged under the first planarization layer OC1 that is an organic layer. However, the first heat dissipation pattern HDP1 is not limited to contacting a lower surface of the organic layer.

The second heat dissipation pattern HDP2 may be arranged on the first planarization layer OC1. However, the second heat dissipation pattern HDP2 is not limited to contacting a top surface of the organic layer.

The organic layer including an organic material may be located between the first heat dissipation pattern HDP1 and the second heat dissipation pattern HDP2. Although the organic layer located between the first heat dissipation pattern HDP1 and the second heat dissipation pattern HDP2 is the first planarization layer OC1 as an example, embodiments according to the present disclosure are not limited thereto.

Heat generated by irradiating the laser to the first cutting line LCL1 may be evenly transmitted to the first heat dissipation pattern HDP1 and may be evenly transmitted to the second heat dissipation pattern HDP2. The amount of heat transmitted to the first display panel area DPA1 may be minimized. Heat damage to the second planarization layer OC2 located in the first display panel area DPA1 and including an organic material may be minimized.

A technical idea of the present disclosure may be to arrange the first heat dissipation pattern HDP1 to overlap the cutting line LCL. The first heat dissipation pattern HDP1 may extend in a direction of the dummy area DMA rather than a direction of the display panel area DPA. Heat generated during laser cutting is radiated to the dummy area DMA to minimize damage to the organic layer located in the display panel area DPA. Therefore, the type of the organic layer, the number of the first heat dissipation patterns HDP1, the shape of the first heat dissipation pattern HDP1, whether the organic layer and the first heat dissipation pattern HDP1 are in contact are not limited to the above description.

Although certain embodiments and implementations have been described herein, other embodiments and modifications will be apparent from the present description. Accordingly, the inventive concepts of the present disclosure are not limited to the described embodiments, but rather to the broader scope of the present disclosure and various obvious modifications and equivalent arrangements as would be apparent to a person of ordinary skill in the art.

What is claimed is:

1. A mother panel for a display panel comprising:
   a mother substrate including a display panel area and a dummy area surrounding the display panel area, the mother substrate having a cutting line defined thereon, wherein the cutting line is configured to be irradiated by a laser along a boundary between the display panel area and the dummy area; and
   a first heat dissipation pattern on the mother substrate, extending from the display panel area to the dummy area to overlap the cutting line, and including a first rod portion including a plurality of lower rods spaced apart from each other and a first body portion in the dummy area and contacting the first rod portion,
   wherein an area in which the first heat dissipation pattern overlaps the dummy area is greater than an area in which the first heat dissipation pattern overlaps the display panel area.

2. The mother panel of claim 1, wherein the first rod portion extends in a direction perpendicular to the cutting line to contact the first body portion.

3. The mother panel of claim 1, wherein at least two of the plurality of the lower rods extend in different directions to contact the first body portion.

4. The mother panel of claim 1, wherein an area in which each of the plurality of the lower rods overlaps the dummy area is greater than an area in which each of the plurality of the lower rods overlaps the display panel area.

5. The mother panel of claim 1, wherein an area of the first body portion is greater than an area of each of the plurality of the lower rods.

6. The mother panel of claim 1, wherein a width of each of the plurality of the lower rods is smaller than a width of the first body portion.

7. The mother panel of claim 1, wherein a width of each of the plurality of the lower rods is same.

8. The mother panel of claim 1, wherein the first rod portion includes a same material as the first body portion.

9. The mother panel of claim 1, wherein the first heat dissipation pattern includes metal.

10. The mother panel of claim 1, further comprising:
    an organic layer on the mother substrate in the display panel area and including an organic material.

11. The mother panel of claim 10, wherein the first heat dissipation pattern is on the organic layer.

12. The mother panel of claim 10, wherein the first heat dissipation pattern is between the mother substrate and the organic layer.

13. The mother panel of claim 1, further comprising:
    a second heat dissipation pattern on the first rod portion, extending from the display panel area to the dummy area to overlap the cutting line, and including a second rod portion including a plurality of upper rods spaced apart from each other and a second body portion in the dummy area and contacting the second rod portion.

14. The mother panel of claim 13, further comprising:
    an organic layer between the first heat dissipation pattern and the second heat dissipation pattern and including an organic material.

15. The mother panel of claim 13, wherein the plurality of the lower rods does not overlap the plurality of the upper rods.

16. The mother panel of claim 1, further comprising:
    a transistor layer including a metal layer on the mother substrate, a buffer layer on the metal layer, an active layer on the buffer layer, a gate electrode on the active layer, an interlayer insulating layer on the gate electrode, a connection electrode on the interlayer insulating layer, a first passivation layer on the connection electrode, and a first planarization layer on the first passivation layer;
    a light emitting diode layer including a first electrode on the first planarization layer, a second electrode on the first planarization layer and spaced apart from the first electrode, a light emitting diode between the first electrode and the second electrode, a second passivation layer on the light emitting diode, and a second planarization layer on the second passivation layer;
    a wavelength conversion layer including a wavelength conversion part on the second planarization layer and a third planarization layer on the wavelength conversion part;
    a color filter layer including a color filter on the third planarization layer and a third passivation layer on the color filter; and
    an encapsulation layer on the third passivation layer.

17. The mother panel of claim 16, wherein the first passivation layer and the first planarization layer extend from the display panel area to the dummy area, and
    wherein the first heat dissipation pattern is between the first passivation layer and the first planarization layer.

18. The mother panel of claim 16, wherein the first planarization layer extends from the display panel area to the dummy area, and
    wherein the first heat dissipation pattern is on the first planarization layer.

19. The mother panel of claim 18, wherein the first heat dissipation patterns include a same material as the first electrode.

20. The mother panel of claim 16, wherein the second passivation layer and the second planarization layer extend from the display panel area to the dummy area, and
    wherein the first heat dissipation pattern is between the second passivation layer and the second planarization layer.

21. The mother panel of claim 16, wherein the second planarization layer extends from the display panel area to the dummy area, and
    wherein the first heat dissipation pattern is on the second planarization layer.

22. The mother panel of claim 16, wherein the third passivation layer and the encapsulation layer extend from the display panel area to the dummy area, and
    wherein the first heat dissipation pattern is between the third passivation layer and the encapsulation layer.

23. The mother panel of claim 1, wherein the mother substrate includes an organic material, and
    wherein the first heat dissipation pattern is on the mother substrate.

24. The mother panel of claim 23, wherein the mother substrate includes polyimide.

25. The mother panel of claim 16, wherein the first heat dissipation pattern includes a same material as the metal layer.

\* \* \* \* \*